(12) United States Patent
Yamada et al.

(10) Patent No.: US 11,391,852 B2
(45) Date of Patent: Jul. 19, 2022

(54) RADIATION DETECTION ELEMENT, AND METHOD FOR MANUFACTURING SAME

(71) Applicant: JX NIPPON MINING & METALS CORPORATION, Tokyo (JP)

(72) Inventors: Kohei Yamada, Kitaibaraki (JP); Koji Murakami, Kitaibaraki (JP); Akira Noda, Kitaibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 17/041,875

(22) PCT Filed: Sep. 14, 2018

(86) PCT No.: PCT/JP2018/034262
§ 371 (c)(1),
(2) Date: Sep. 25, 2020

(87) PCT Pub. No.: WO2019/187217
PCT Pub. Date: Oct. 3, 2019

(65) Prior Publication Data
US 2021/0011180 A1    Jan. 14, 2021

(30) Foreign Application Priority Data
Mar. 29, 2018   (JP) .............................. JP2018-064123

(51) Int. Cl.
*G01T 1/24*       (2006.01)
*H01L 27/146*     (2006.01)

(52) U.S. Cl.
CPC ........ *G01T 1/241* (2013.01); *H01L 27/14603* (2013.01); *H01L 27/14659* (2013.01); *H01L 27/14696* (2013.01)

(58) Field of Classification Search
CPC ..... G01T 1/241; G01T 1/24; H01L 27/14603; H01L 27/14659; H01L 27/14696;
(Continued)

(56) References Cited

U.S. PATENT DOCUMENTS

2002/0131011 A1* 9/2002 Izumi ................... G02F 1/1339
                                                                349/199
2006/0121716 A1   6/2006 Petroz
(Continued)

FOREIGN PATENT DOCUMENTS

JP           8-5749 A       1/1996
JP           8-125203 A     5/1996
(Continued)

OTHER PUBLICATIONS

Translation of JP 2013157494 A (Year: 2013).*
(Continued)

*Primary Examiner* — David P Porta
*Assistant Examiner* — Mamadou Faye
(74) *Attorney, Agent, or Firm* — Birch, Stewart, Kolasch & Birch, LLP (57) ABSTRACT

Provided is a radiation detection element, including: a plurality of electrode portions on a surface of a substrate; and an insulating portion between the electrode portions, the substrate being made of a compound semiconductor crystal containing cadmium telluride or cadmium zinc telluride, wherein an intermediate layer containing tellurium oxide is present between each of the electrode portions and the substrate, and wherein the tellurium oxide layer has a thickness of 100 nm or less on a 500 nm inner side from an end portion of the insulating portion between the electrode portions. The radiation detection element has higher adhesion of the electrodes, and does not result in an element performance defect caused by insufficient insulation
(Continued)

between the electrodes, even if the radiation detection element has a narrower distance between the electrode portions in order to obtain a high-definition radiographic image.

11 Claims, 5 Drawing Sheets

(58) Field of Classification Search
CPC ........... H01L 31/0224; H01L 31/02966; H01L 31/115; H01L 31/09
See application file for complete search history.

(56) References Cited

U.S. PATENT DOCUMENTS

| | | |
|---|---|---|
| 2007/0194243 A1 | 8/2007 | Chen et al. |
| 2011/0049376 A1 | 3/2011 | Zhang et al. |
| 2012/0295013 A1* | 11/2012 | Tsunekawa ......... C23C 18/1619 427/8 |
| 2016/0240584 A1 | 8/2016 | El-Hanany |
| 2017/0108594 A1* | 4/2017 | Murakami ............ H01L 27/144 |
| 2018/0061792 A1 | 3/2018 | Mikami et al. |

FOREIGN PATENT DOCUMENTS

| | | | |
|---|---|---|---|
| JP | 2003-142673 A | | 5/2003 |
| JP | 2009-527922 A | | 7/2009 |
| JP | 2013-503481 A | | 1/2013 |
| JP | 2013-157494 A | | 8/2013 |
| JP | 2013157494 A | * | 8/2013 |
| JP | 2015-70072 A | | 4/2015 |
| WO | WO 2016/157589 A1 | | 10/2016 |

OTHER PUBLICATIONS

English translation of the International Preliminary Report on Patentability (forms PCT/IPEA/409 and PCT/IB/338), dated Oct. 1, 2020, for corresponding International Application No. PCT/JP2018/034262.
International Search Report (PCT/ISA/210) issued in PCT/JP2018/034262, dated Dec. 4, 2018.
Extended European Search Report for corresponding European Application No. 18911547.0, dated Nov. 30, 2021.

* cited by examiner

RADIATION DETECTION ELEMENT, AND METHOD FOR MANUFACTURING SAME

FIELD OF THE INVENTION

The present invention relates to a radiation detection element using a compound semiconductor crystal containing cadmium telluride (CdTe) or cadmium zinc telluride (CdZnTe).

BACKGROUND OF THE INVENTION

A crystalline material of cadmium telluride (CdTe), which is a Group II-VII compound of cadmium (Cd), a Group II (Group 2B) element, and tellurium (Te), a Group VI (Group 6B) element, is a crystalline compound semiconductor material with a relatively large band gap (~1.44 eV). Further, CdTe-based compound semiconductor crystal materials, including zinc cadmium telluride (CdZnTe) having a further increased band gap by replacing a part of Cd of CdTe with Zn as a homologous element, are suitably used in wide variety applications such as optical elements of solar cells, electro-optical modulators and infrared windows, and radiation detectors such as dark-field cameras and infrared telescopes, and radiation detectors such as X-ray photographs, X-ray computer tomography (CT), and environmental radiation measuring instruments.

Among them, in the radiation detector application, it is possible to electrically detect the radiation by applying a high bias voltage to an insulating CdTe-based crystal having a high resistivity, and converting incidence of the radiation into a current signal by a (internal) photoelectric effect generated when the radiation is incident upon the crystal material. That is, the radiation detection element that will be a main part for detecting the radiation in the radiation detector is composed of at least a CdTe-based crystal material and an electrode for applying a high bias voltage to the crystal material.

If the radiation detection element is formed such that a plurality of electrodes are arranged at different positions on the surface of the CdTe crystal, the radiation can be detected according to the positions of the electrodes. Arrangement of a plurality of electrodes in the form of a matrix using it can provide a radiation image corresponding to a pixel in which each electrode detects the radiation. An X-ray photograph or an X-ray CT is to obtain a drawn image of X-ray, which is a kind of radiation, by applying the above principle. With regard to such a radiation detection element, techniques and the like disclosed in Patent literatures 1 to 3 are known in the art.

The radiation detection element in which a plurality of electrodes are arranged at different positions on the CdTe-based crystal is produced by arranging the plurality of electrodes at predetermined intervals on a surface of a substrate made of a semiconductor crystal containing the CdTe-based compound. In this regard, Patent Literature 1 forms thin films that will be electrodes, by masking portions corresponding to spaces between a plurality of electrodes on a substrate surface with resist films or the like, and in this state, immersing the substrate in a plating solution to plate unmasked portions on the substrate surface to form conducting layers on the unmasked portions. For a means for forming the electrode films, there is a conventional technique using an evaporation method instead of the plating method as in Patent Literature 4. After the formation of the electrode films, masking materials such as the resist films are removed.

Patent Literature 1 forms an intermediate layer containing a Te oxide having a resistivity of $10^7$ $\Omega \cdot cm$ or less between the formed electrode and a substrate surface by carrying out a plating treatment using a specific plating solution under specific conditions when forming the electrode by the above method. The presence of the intermediate layer can lead to significant improvement of adhesion between the surface of the substrate made of the crystalline material containing the CdTe-based compound and the formed electrode material in the form of thin film.

The technique disclosed in Patent Literature 1 is very useful for obtaining the radiation detection element having high adhesion between the substrate and the electrode layer, high durability, and long life. As a recent technological trend, there has been an increasing need for high definition of drawn images of the radiation detection element, and a distance between the electrodes has been reduced in addition to areas of individual electrodes accordingly. In order to reliably separate electrical signals from the respective electrodes to obtain a high-definition image, it is important to ensure that the electrodes are insulated even if the distance between the electrodes is reduced and narrowed. Therefore, a material between the electrodes, i.e., a substrate itself made of a crystalline material containing a CdTe-based compound should have a sufficiently high resistivity.

However, it is observed that only controlling of the resistance value of the substrate is insufficient for insulation, and an element performance defect (e.g., leakage current between the electrodes) caused by the insufficient insulation between the electrodes is generated, especially when producing radiation detection element having a narrower distance between the electrodes. The element having such a defect cannot appropriately separate the detection signals of the radiation according to the position of each electrode, resulting in events where spatial resolution is decreased to blur a drawn image, and in some cases, a function as a radiation detection element cannot be achieved, and the like.

CITATION LIST

Patent Literatures

[Patent Literature 1] Japanese Patent Application Publication No. 2013-157494 A
[Patent Literature 2] Japanese Patent Application Publication No. 2013-503481 A
[Patent Literature 3] Japanese Patent Application Publication No. 2003-142673 A
[Patent Literature 4] Japanese Patent Application Publication No. H08-125203 A

SUMMARY OF THE INVENTION

The present disclosure is intended to solve the above problems. An object of the present disclosure is to provide a radiation detection element, which has higher adhesion between each electrode and a substrate, and which does not result in an element performance defect caused by insufficient insulation between the electrodes, even if the radiation detection element has a narrower distance between the electrode portions in order to obtain a high-definition radiographic image. Another object of the present disclosure is to provide a method for manufacturing such a radiation detection element.

As a result of intensive studies to solve the above problems, the present inventors have found that the insufficient insulation between the electrode portions of the element as described above is generated by the formation of a conductive oxide in a part near the surface of the insulating portion between the electrode portions, which originally has high resistivity, and flowing of a current as a leakage path through the oxide, and that by decreasing the thickness of the conductive oxide at the end portion of the insulating portion between the electrode portions to a predetermined range or less, the leakage path of the current can be blocked to prevent the generation of element failure. Based on the findings, the present inventors have completed the present invention.

Based on the findings as described above, the present disclosure provides the following inventions:

1) A radiation detection element, comprising: a plurality of electrode portions on a surface of a substrate; and an insulating portion between the electrode portions, the substrate comprising a compound semiconductor crystal containing cadmium telluride or cadmium zinc telluride, wherein an intermediate layer containing tellurium oxide is present between each of the electrode portions and the substrate, and wherein the tellurium oxide layer has a thickness of 100 nm or less on a 500 nm inner side from an end portion of the insulating portion between the electrode portions.
2) The radiation detection element according to 1), wherein the insulating portion between the electrode portions has a width of 100 μm or less.
3) The radiation detection element according to 1) or 2), wherein the insulating portion between the electrode portions is a compound semiconductor crystal containing cadmium telluride or cadmium zinc telluride.
4) The radiation detection element according to any one of 1) to 3), wherein each of the electrode portions comprises a thin film containing platinum, gold, or an alloy containing at least one of platinum and gold.
5) The radiation detection element according to any one of 1) to 4), wherein, in a cross section perpendicular to a surface of the substrate, each of the electrode portions has a concave shape, and the insulating portion between the electrode portions has a convex shape.
6) The radiation detection element according to any one of 1) to 5), wherein, when the compound semiconductor crystal is a cadmium zinc telluride crystal ($Cd_{1-x}Zn_xTe$), it is a cadmium zinc telluride crystal having a concentration x of zinc in a Group II element of 2 at % or more and 10 at % or less.
7) The radiation detection element according to any one of 1) to 6), wherein the surface of the substrate made of the compound semiconductor crystal has an orientation plane of {111}, {110}, or {100}.
8) A method for manufacturing the radiation detection element according to any one of 1) to 7), the method comprising: forming a resist film on a substrate in a portion corresponding to the insulating portion between the electrode portions, the substrate comprising a compound semiconductor crystal containing cadmium telluride or zinc cadmium telluride; immersing the substrate having the formed resist film in a plating solution to form electrode portions in portions corresponding to the electrode portions; and removing the resist film.
9) The method for manufacturing the radiation detection element according to 8), wherein the substrate is immersed in the plating solution to form the electrode portions and a tellurium oxide-containing intermediate layer between each of the electrode portions and the substrate.
10) The method for manufacturing the radiation detection element according to 8) or 9), wherein the plating solution contains from 10 ml/L to 30 ml/L of hydrochloric acid having a concentration of 35%.
11) The method for manufacturing the radiation detection element according to any one of 8) to 10), wherein an electroless plating treatment time with the plating solution is 50 seconds or more and 70 seconds or less.

According to the present disclosure, it is possible to provide a radiation detection element which has higher adhesion between each of electrode portions and a substrate and which can surely prevent generation of any element performance defect caused by leakage current resulting from insulation failure between the electrode portions to provide high-definition and high performance, even if the radiation detection element has a narrower distance between the electrode portions, in a radiation detector using a CdTe-based compound semiconductor crystal such as CdTe or CdZnTe. It is also possible to reduce a defective product rate of the element to improve a yield for element production.

DETAILED DESCRIPTION OF THE INVENTION

A radiation detection element according to the present disclosure includes: multiple, i.e., at least two or more electrode portions on a surface of a substrate made of a compound semiconductor crystal containing CdTe or CdZnTe; and at least one insulating portion between the electrode portions. A material used as the substrate is a crystalline material containing CdTe, or CdZnTe in which Cd of CdTe is partially substituted with Zn, which is preferably a single crystal material. The crystalline material containing CdTe or CdZnTe, which forms the substrate, may further contain a dopant element(s) such as indium (In) and chlorine (Cl).

Figure 1:
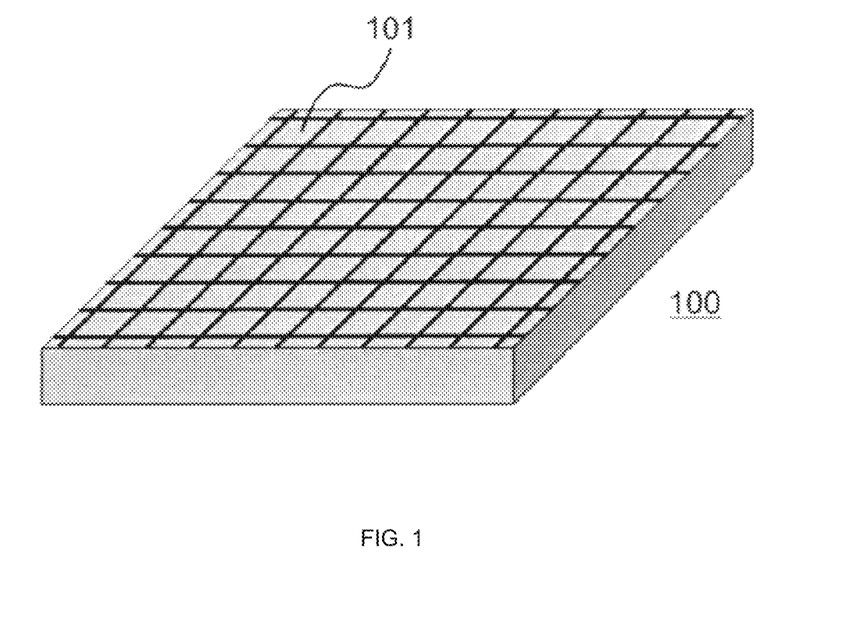
FIG. 1 is an external view of a radiation detection element.

FIG. 1 shows an example of the entire appearance of a radiation detection element 100 according to the present disclosure. In this embodiment illustrated in this figure, a plurality of electrode portions 101 provided on a surface of a substrate are arranged in the form of matrix in a vertical direction and in a crosswise direction orthogonal to the vertical direction. However, the radiation detection element according to the present disclosure is not limited to such a specific embodiment. As described above, radiation detection elements in which at least two or more electrode portions are provided on the surface of the substrate and there is a region where no electrode portion is present between the electrode portions will be encompassed in the scope of the present disclosure.

Figure 2:
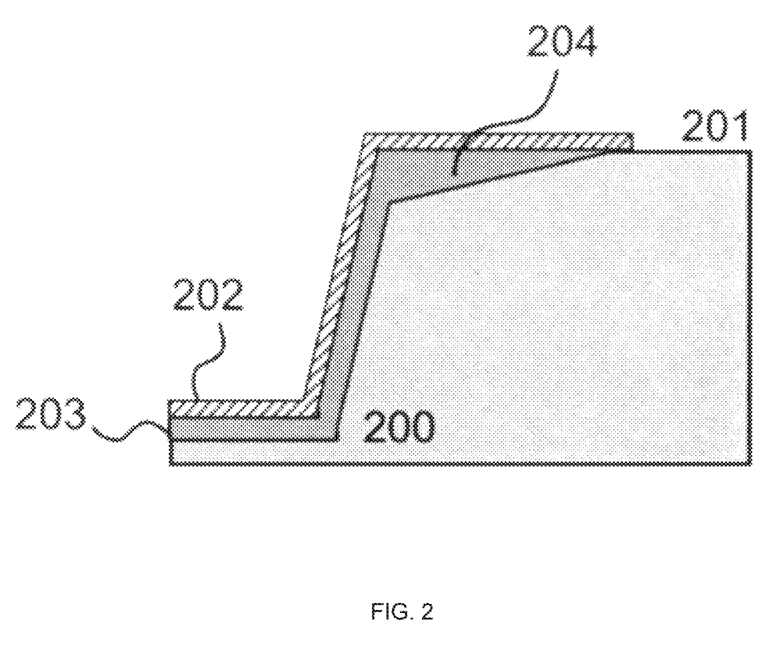
FIG. 2 is an enlarged cross-sectional view of a radiation detection element.

FIG. 2 schematically shows an enlarged cross-sectional view of the vicinity of the electrode portion and an insulating portion in FIG. 1. Between two adjacent electrode portions on a surface of a substrate 200 is an insulating portion 201 having higher resistivity. Each of the electrode portions is separated by the insulating portion to define a spatial radiation detection region for each electrode portion. Therefore, the insulating portion between the electrode portions should have a sufficiently high resistivity such that a current path does not occur between the adjacent electrode portions, which can be, for example, $10^7$ Ω·cm or more. In FIG. 2, the surface of each electrode portion is formed at a position lower than the surface of the insulating portion between the electrode portions, although not limited thereto. Both may be in the same plane, or the surface of each electrode portion may be formed at a position higher than the surface of the insulating portion between the electrode portions.

Between the electrode portion 202 and the surface of the substrate 200 is an intermediate layer 203 containing an oxide of Te. A substance forming the oxide layer is the oxide of Te, which is a conductive oxide having an atomic ratio of oxygen (O) to Te (O/Te) in a range of approximately 0.6 to 1. Therefore, electrical charges in the semiconductor can also reach the electrode portions through the oxide layer. The intermediate layer containing the oxide of Te is interposed between the surface of the substrate made of the compound semiconductor crystal containing CdTe or CdZnTe and the electrode material, thereby producing an effect of improving the adhesion of the electrode portions. A thickness of the intermediate layer is not particularly limited as long as an effect of improving the adhesion of the electrode portions is produced.

The Te oxide layer 204 is also present on a surface of an end portion of the insulating portion between the electrode portions, which is adjacent to the electrode portion, such that the intermediate layer of the electrode portion as described above extends. For that portion, the preset disclosure is characterized by a thickness of the Te oxide layer of 100 nm or less on a 500 nm inner side from the end portion of the insulating portion. A thickness of the Te oxide layer in this portion of more than 100 nm significantly increases tendency to form a current leakage path in the insulating portion between the electrode portions due to the oxide layer, resulting in possibility of insulation failure of the insulating portion between the electrode portions. The thickness of the Te oxide layer in this portion may be 70 nm or less, or 50 nm or less.

The present disclosure is effectively applied to the radiation detection element in which the insulating portion between the electrode portions has a width of 100 μm or less. As the width of the insulating portion between the electrode portions is decreased, the leakage path of the current is easily formed in the insulating portion. However, by applying the technique of the present disclosure, such an adverse effect can be eliminated. The width of the insulating portion between the electrode portions is defined as the shortest linear distance from the end portion of the insulating portion on one side of the electrode portion to the end portion of the insulating section on other side of the electrode portion. The width of the insulating portion between the electrode portions may be 70 μm or less, or 50 μm or less.

The insulating portion present between the electrode portions adjacent to each other can be made of a compound semiconductor crystal containing CdTe or CdZnTe. In particular, a preferable structure is that the insulating portion 201 is configured in such a form that a part of the insulating ($10^7$ Ω·cm or more) compound semiconductor crystal material containing CdTe or CdZnTe that forms the substrate is partially exposed on the surface of the substrate such that the compound semiconductor crystal material separates the two electrode portions between the adjacent electrode portions, although not limited thereto. It may be a structure in which the insulating portion between the electrode portions is provided such that the insulating portion is made of an insulating material different from the substrate.

The structure and shape of each electrode portion are not particularly limited. Each electrode portion may be formed according to a desired design. However, considering the viewpoint of the element forming process, miniaturization of the element, and the ease of handling, the electrode portions can be provided on the substrate in the form of thin film. Further, in view of the adhesion to the Te oxide layer formed on the surface of the substrate, the electrode portions can be made of a metal material, especially including platinum (Pt), gold (Au), or an alloy material containing at least one of Pt and Au, as an option for such a metal material.

The insulating portion present between the electrode portions can be formed into a structure in which the insulating portion is configured to be partially exposed on the surface of the substrate so as to separate the two electrode portions between the adjacent electrode portions, as discussed above. In addition, when the surface of the substrate made of the compound semiconductor crystal containing CdTe or CdZnTe, which forms the electrode portions, contains a crystal strain layer, a modified layer, or the like, which is generated during surface processing of the substrate, the removal of that layer can allow radiation detection performance to be improved. The strain layer or the modified layer on the surface may be removed only on the surface of the portion where each of the electrode portions is formed. In this case, the electrode portions may be configured such that each of the electrode portions is present at a position lower than the surface of the insulating portion between the electrode portion and the adjacent insulating portion so that each electrode portion has a concave shape and the insulating portion has a convex shape. When each electrode portion is concave shaped and the insulating portion is convex shaped, and the boundary between them is continuous in an inclined manner, the "end portion of the insulating portion" can be a portion where in the cross section of the substrate in FIGS. 4 and 5, an extrapolated line in contact with the surface of the insulating portion and parallel to the surface begins to descend downward from the extrapolated line due to the concave portion of each electrode portion.

When a material of the compound material making up the substrate is a cadmium zinc telluride crystal ($Cd_{1-x}Zn_xTe$), it can be a CdZnTe crystal having a concentration x of zinc in the Group II element of 2 at % or more and 10 at % or less. The Zn concentration in such a range can allow the CdTe-based semiconductor crystalline material to be controlled to a suitable bandgap for use as the radiation detector, and can also improve the insulating properties to form an element with less leakage current. The concentration x of zinc may be 3 at % or more, or 5 at % or more, and 9 at % or less, or 7 at % or less.

A plane orientation on the surface of the substrate made of the compound semiconductor crystal can have any orientation depending on crystal characteristics and/or required radiation detection performance. It may be any orientation plane of {111}, {110}, or {104}.

The above radiation detection element may be manufactured by any manufacturing method regardless of its content as long as it includes means that can obtain the above features. Hereinafter, an example of manufacturing methods capable of effectively obtaining the structure and structural features of the above radiation detection element will be described, but the present invention is not limited thereto.

Figure 3:
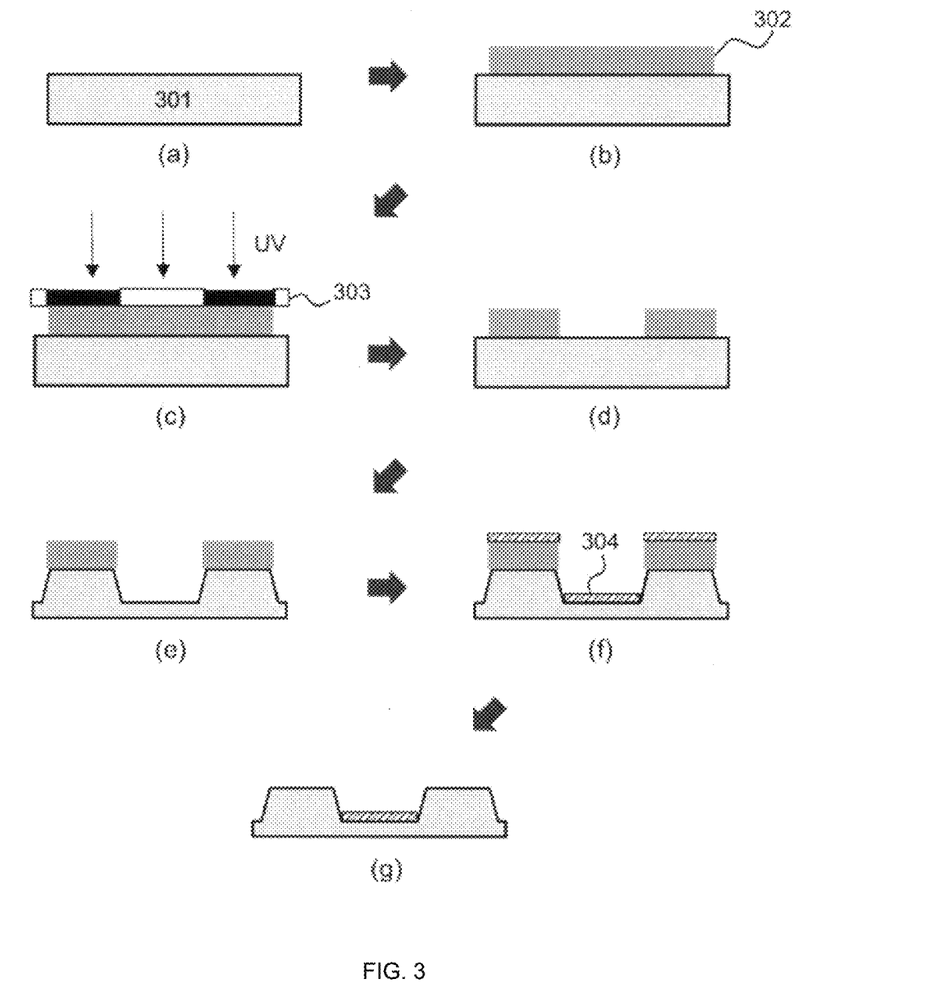
FIG. 3 is an example of manufacturing steps for a radiation detection element.

FIG. 3 schematically illustrates steps of an example of the methods for manufacturing the radiation detection element according to the present disclosure. In the method of the example, first, a substrate 301 made of a compound semiconductor crystal containing CdTe or CdZnTe is prepared (FIG. 3(a)). The substrate may be optionally subjected to a washing treatment, an etching treatment of the entire substrate surface as a pretreatment, and the like. To the entire surface of the substrate is then applied a resist film 302 serving to protect the substrate surface from an etching solution in the subsequent etching step by means of a coating method or the like (FIG. 3(b)).

Subsequently, for the resist film formed on the entire surface of the substrate, portions corresponding to the electrode portions are removed, leaving only a portion (pattern) corresponding to the insulating portion between the electrode portions. In this case, the above operation can be efficiently carried out by removing exposed portions with lithography or the like using a photomask 303 having such a pattern that only the electrode portions are exposed, using the resist film as a photosensitive material (FIG. 3(c)). Then, the resist film is formed only on the portion of the substrate surface, which corresponds to the insulating portion between the electrode portions (FIG. 3(d)).

In order to remove a crystal strain layer, a modified layer or the like remaining on the surface of the substrate from the portions where the resist film has been removed and the surface of the substrate is exposed, that is, the electrode forming portions, are etched by immersing the substrate in an etching solution. As a result, the surface of the substrate where the resist film is not present is etched into a concave shape, and the portion where the resist film is present remains as a convex shape (FIG. 3(e)). The substrate in this state is then immersed in a plating solution to form plated films 304 on the substrate surfaces where the resist film is not present, by means of a plating method (FIG. 3(f)). The films of the concave portions will be the electrode portions.

By adjusting a composition of the plating solution for use in the above step, the intermediate layer containing the Te oxide can be simultaneously formed between the formed plated film and the substrate surface. The plating solution used in this case may contain, in addition to the components for depositing the electrode material to be formed by plating, from 10 ml/L to 30 ml/L of hydrochloric acid (HCl) having a concentration of 35%. It is believed that when films that will be the electrode portions are formed by the plating method, a region where Te is excessive is generated in a reaction field between CdTe or CdZnTe of the substrate and the electrode material, and when HCl is present therein, the incorporation of oxygen present in the plating solution is facilitated to form the Te oxide. An electroless plating treatment time with the plating solution is preferably 50 seconds or more and 70 seconds or less.

As the electrode portions and the intermediate layer containing the Te oxide are simultaneously formed by the above method, the Te oxide layers are also formed on a side wall portion of the insulating portion between the electrode portions and on a part of the end portion of the insulating portion underlying the resist film. Although the reason why the Te oxide is also formed on the part of the end portion of the insulating portion underlying the resist film is not necessarily clear, it is believed that the main reason is that the plating solution penetrates into a boundary between the resist film and the surface of the insulating portion from the end portion. The radiation detection element according to the present disclosure is characterized in that the thickness of the Te oxide layer on a 500 nm inner side from the end portion of the insulating portion is 100 nm or less, and the thickness can be controlled by adjusting a plating time, as well as the hydrochloric acid concentration, concentrations of other components contained in the plating solution and even plating conditions such as a solution temperature to appropriate ranges.

The formation of the electrode portions is not necessarily performed by the above plating method, and may be performed by other known methods including a dry method such as a vacuum evaporation method, a sputtering method, and a chemical vapor deposition (CVD) method. However, in this case, the step of forming the intermediate layer containing the conductive Te oxide between the electrode material and the surface of the substrate should be separately performed before forming the electrode portions. In this case, the thickness of the Te oxide layer at the end portion of the insulating portion can also be controlled by appropriately adjusting conditions according to the applied processing means.

The resist film remaining on the surface of the insulating portion between the electrode portions can be then removed (lifted off) to provide a basic structure (FIG. 3(g)) of the radiation detection element according to the present disclosure. It should be noted that any step may be added; for example, prior to removal of the resist film, under bump metal (UBM) layers may be formed on the surfaces of the electrode portions, or after removal of the resist film, packaging as a final element may be carried out by a passivation treatment or the like.

EXAMPLES

Hereinafter, the technical contents of the present disclosure will be specifically described based on Example and Comparative Examples. The descriptions of the following Example and Comparative Examples are merely specific examples for facilitating the understanding of the technical contents of the present disclosure, and the technical scope of the present invention is not limited by these specific examples.

Example 1

A substrate made of CdZnTe single crystal (having a concentration of Zn in the Group II element of 3 at %) and having a surface of a (111) plane was prepared as the substrate. The substrate was washed, then dried and etched over the entire surface as a pretreatment. UV lithography was carried out by coating a photoresist on the surface of the substrate and drying it, and then exposing the photoresist film to an ultraviolet ray (UV) via a photomask having patterns with portions corresponding to the electrode portions being translucent and a portion corresponding the insulating portion between the electrode portions being shading, and developing the exposed portions and removing them to subject the photoresist film to patterning. In this example, the size of each electrode portion was 0.2 mm×0.3 mm, and the width of the portion corresponding to the insulating portion between the electrodes was 40 μm.

Subsequently, the substrate having the patterned photoresist film on the surface was immersed in an etching solution composed of 300 ml of hydrobromic acid (HBr), 6 ml of bromine (Br), and 300 ml of water to etch portions of the substrate surface where CdZnTe was exposed, that is, the electrode forming portions to remove crystal strain and/or modified portions remaining on the substrate surface. The substrate was washed and dried again, and then immersed in a plating solution obtained by mixing 20 ml of 35% hydrochloric acid (HCl) with 1 g of chloroplatinic acid (IV) hexahydrate ($H_2PtCl_6 \cdot 6H_2O$) and 1.2 L of pure water (35% HCl concentration is nearly equal to 16.4 ml/L) to form electrode portions composed of a Pt plated film. In this example, the electrode portions were formed by setting the temperature of the plating solution to 50° C. and the plating time to one minute.

Figure 4:
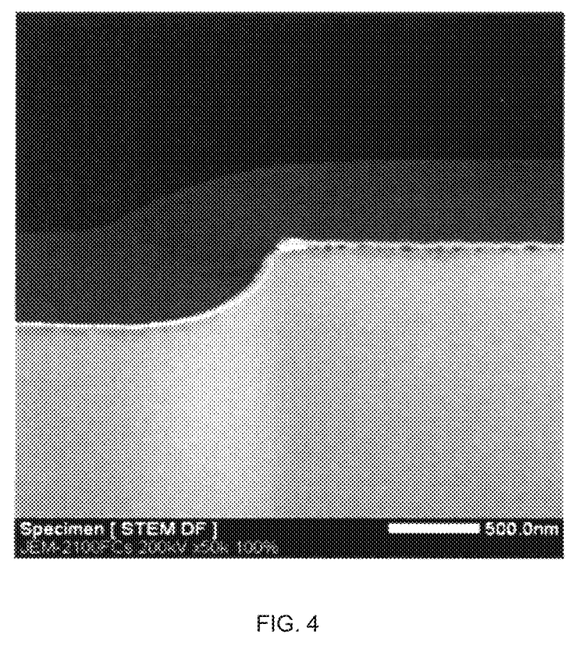
FIG. 4 is an enlarged cross-sectional image of a radiation detection element of Example 1.

After the formation of the electrode portions, the photoresist was removed, and the substrate was washed and dried. A cross-sectional structure of the element obtained in this example was observed by a focused ion beam secondary electron microscope (FIB-SEM). FIG. 4 shows an enlarged cross-sectional image by the FIB-SEM. The enlarged image confirmed that Pt electrode layers were formed on surfaces of the electrode portions of the CdZnTe substrate etched into a concave shape, via the intermediate layers containing Te oxide. The thicknesses of the intermediate layer containing the Te oxide and the Pt electrode layer in this example were both 30 to 50 nm.

Further, the convex portion adjacent to the concave portion in which the electrode portion is formed in the enlarged view corresponds to the insulating portion between the electrode portions. The layer composed of Te oxide is formed near the side wall portion of the convex portion and the end portion of the upper surface of the convex portion. In this example, it was confirmed that the thickness of the Te oxide layer was 30 to 50 nm on a 500 nm inner side from the convex portion, that is, the end portion of the insulating portion between the electrode portions. Further, it was confirmed that the thickness of the Te oxide layer decreased as the distance from the end of the insulating portion increased, and the region where the Te oxide layer disappeared was present around the midpoint between one end portion and the other end portion.

Further, the above element was subjected to a voltage application test. The test was conducted by placing the element in a dark room that was not affected by electromagnetic waves such as radiation, and measuring values of current flowing when probe terminals were brought into contact with the electrode portions adjacent to each other across the insulating portion to apply a high voltage of 900V. As a result, a value of leakage current flowing between the electrode portions of the element disposed in the dark room was extremely low, which was a good result.

Comparative Example 1

Figure 5:
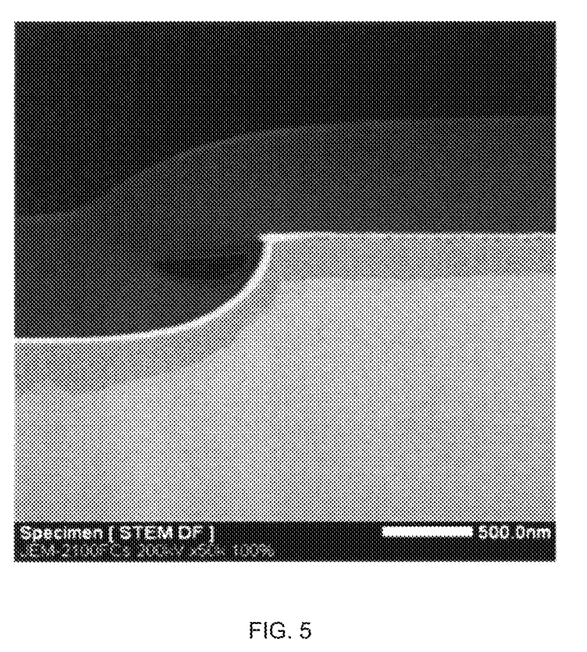
FIG. 5 is an enlarged cross-sectional image of a radiation detection element of Comparative Example 1.

An element was produced in the same method and conditions as those of Example 1, with the exception that during the formation of the electrode portions, the plating time was set to 10 minutes for immersing the substrate in the plating solution to form the Pt plated film. Further, for the resulting element, a cross-sectional structure of the element was observed in the same method as that of Example 1. FIG. 5 shows an enlarged cross-sectional image by FIB-SEM of the element obtained in this example. As with Example 1, the intermediate layer containing the Te oxide was formed between the surface of the CdZnTe substrate and the Pt electrode layer in the concave electrode portions, but the thickness of the intermediate layer was increased as compared with Example 1. The thicknesses of the intermediate layer containing the Te oxide and the Pt electrode layer in this example were from 250 to 300 nm and from 30 to 50 nm, respectively.

Furthermore, Comparative Example 1 is the same as Example 1 in that a layer made of Te oxide was formed on the side wall portion of the insulating portion between the electrode portions and near the end portion of the upper surface of the insulating portion. It was, however, confirmed that the Te oxide layer was thicker than that of Example 1, and in particular, the thickness of the Te oxide layer on a 500 nm inner side from the end portion of the insulating portion reached 260 nm. Further, although the thickness of the Te oxide layer tended to decrease away from the end portion of the insulating portion, it could not be confirmed that the region where the Te oxide layer clearly disappeared from one end portion to the other end portion of the insulating portion. Moreover, the voltage application test was conducted in the same method as that of Example 1, and as a result, significantly larger leakage current between the electrode portions than that of Example was observed.

Comparative Example 2

An element was produced by the same method and conditions as those of Example 1, with the exception that 35% HCl was not added to the plating solution and the plating time was set to 3 minutes. Then, the cross-sectional structure of the resulting element was observed by the same method as that of Example 1. In this example, it could not be confirmed that an intermediate layer containing Te oxide was formed between the surface of the CdZnTe substrate and the Pt electrode layer in the concave electrode portions. The thickness of the Pt electrode layer in this example was 120 nm.

In this example, the layer composed of the Te oxide was not formed even on the side wall portion of the insulating portion between the convex electrode portions and near the end portion of the upper surface of the insulating portion. The electrode portions of the element obtained in this example was subjected to evaluation of an adhesion of the electrode plated film by a tape test method in the plating adhesion test in accordance with JIS H 8504. As a result, an area of more than 5% of the plated film was peeled off, which confirmed poor adhesion of the electrode portions, that is, poor durability of the element.

These results are summarized in Table 1. It should be noted that the "Thickness of Te Oxide Layer at End of Insulating Portion" in Table 1 indicates "the thickness of the Te oxide layer on a 500 nm inner side from the end portion of the insulating portion".

TABLE 1

|  | Thickness of Te Oxide Layer at End of Insulating Portion (nm) | Disspation of Te Oxide Layer in Insulating Portion | Leakage Current | Peeling of Electrode | Remarks |
| --- | --- | --- | --- | --- | --- |
| Example 1 | 40 | ○ | Slight | Non | Plating Time of 1 min |
| Comparative Example 1 | 260 | x | Present | Non | Plating Time of 10 min |
| Comparative Example 2 | 0 | — | — | more than 5% | Plating Solution, No HCl added |

According to the present disclosure, it is possible to ensure insulating properties between electrode portions even if a distance between the electrode portions is reduced and to prevent leakage current from being generated between the electrode portions, in a radiation detection element utilizing a photoelectric effect of a CdTe-based crystal used as a main structure of a radiation detector. This can lead to facilitation of a decreased area and increased density of the electrode portion in the radiation detection element, i.e., an increased resolution and increased definition of the pixel, and can expect significant contributions to techniques such as various types of image analysis and image diagnosis as well as industrial equipment utilizing drawn images obtained by the radiation detection element, such as X-ray photographs and X-ray CTs, and to industrial fields using them.

DESCRIPTION OF REFERENCE NUMERALS 100 radiation detection element
101 electrode portion
200 substrate
201 insulating portion
202 electrode portion
203 intermediate layer
204 Te oxide layer
301 substrate
302 resist film
303 photomask
304 plated film

The invention claimed is:

1. A radiation detection element, comprising: a plurality of electrode portions on a surface of a substrate; and an insulating portion between the electrode portions, the substrate comprising a compound semiconductor crystal containing cadmium telluride or cadmium zinc telluride,
    wherein an intermediate layer containing tellurium oxide is present between each of the electrode portions and the substrate, and wherein the tellurium oxide layer has a thickness of 70 nm or less on a 500 nm inner side from an end portion of the insulating portion between the electrode portions.

2. The radiation detection element according to claim 1, wherein the insulating portion between the electrode portions has a width of 100 μm or less.

3. The radiation detection element according to claim 1, wherein the insulating portion between the electrode portions is a compound semiconductor crystal containing cadmium telluride or cadmium zinc telluride.

4. The radiation detection element according to claim 1, wherein each of the electrode portions comprises a thin film containing platinum, gold, or an alloy containing at least one of platinum and gold.

5. The radiation detection element according to claim 1, wherein, in a cross section perpendicular to a surface of the substrate, each of the electrode portions has a concave shape, and the insulating portion between the electrode portions has a convex shape.

6. The radiation detection element according to claim 1, wherein, when the compound semiconductor crystal is a cadmium zinc telluride crystal ($Cd_{1-x}Zn_xTe$), it is a cadmium zinc telluride crystal having a concentration x of zinc in a Group II element of 2 at % or more and 10 at % or less.

7. The radiation detection element according to claim 1, wherein the surface of the substrate made of the compound semiconductor crystal has an orientation plane of {111}, {110}, or {100}.

8. A method for manufacturing the radiation detection element according to claim 1, the method comprising:
    forming a resist film on a substrate in a portion corresponding to the insulating portion between the electrode portions, the substrate comprising a compound semiconductor crystal containing cadmium telluride or zinc cadmium telluride;
    immersing the substrate having the formed resist film in a plating solution to form electrode portions in portions corresponding to the electrode portions; and
    removing the resist film.

9. The method for manufacturing the radiation detection element according to claim 8, wherein the substrate is immersed in the plating solution to form the electrode portions and a tellurium oxide-containing intermediate layer between each of the electrode portions and the substrate.

10. The method for manufacturing the radiation detection element according to claim 8, wherein the plating solution contains from 10 ml/L to 30 ml/L of hydrochloric acid having a concentration of 35%.

11. The method for manufacturing the radiation detection element according to claim 8, wherein an electroless plating treatment time with the plating solution is 50 seconds or more and 70 seconds or less.

* * * * *